(12) United States Patent
Zehavi et al.

(10) Patent No.: US 11,984,192 B2
(45) Date of Patent: May 14, 2024

(54) INTERFACE BUS SPEED OPTIMIZATION

(71) Applicant: Western Digital Technologies, Inc., San Jose, CA (US)

(72) Inventors: Mordekhay Zehavi, Raanana (IL); Mahmud Asfur, Bat-Yam (IL); Yossef Tamir, Beer-Sheva (IL); Yuri Ryabinin, Beer-Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 150 days.

(21) Appl. No.: 17/841,432

(22) Filed: Jun. 15, 2022

(65) Prior Publication Data
US 2023/0410858 A1    Dec. 21, 2023

(51) Int. Cl.
*G11C 7/10* (2006.01)
*G11C 5/14* (2006.01)
*G11C 7/22* (2006.01)
*G11C 29/52* (2006.01)

(52) U.S. Cl.
CPC .............. *G11C 7/1048* (2013.01); *G11C 5/14* (2013.01); *G11C 7/1039* (2013.01); *G11C 7/22* (2013.01); *G11C 29/52* (2013.01)

(58) Field of Classification Search
CPC .................................................. G11C 7/1048
USPC ......................................................... 327/333
See application file for complete search history.

(56) References Cited

U.S. PATENT DOCUMENTS

| 10,446,254 B1 * | 10/2019 | Zehavi ................ G06F 11/1048 |
| 10,466,920 B2 | 11/2019 | Tzafrir et al. |
| 10,530,347 B2 | 1/2020 | Tang et al. |
| 2010/0153896 A1 | 6/2010 | Sewall et al. |

OTHER PUBLICATIONS

Cacho, F. et al., "Monitoring Setup and Hold Timing Limits", 2021 IEEE International Preliability Physics Symposium (IRPS).
Arora, D.K. et al, "Analysis of Setup and Hold Margins inside Silicon for Advanced Technology Nodes", 17th Int'l Symposium on Quality Electronic Design, 2016.

* cited by examiner

*Primary Examiner* — Tomi Skibinski
(74) *Attorney, Agent, or Firm* — Rutan & Tucker LLP; Hani Z. Sayed; Ravi Mohan

(57) ABSTRACT

Various devices, such as storage devices or systems are configured to transmit data between various components over one or more interfaces. The operation of these interfaces is based on the mechanical limits of the components doing the communication, often latches. Latches often require a setup and hold time limit on the signal being transmitted to be held a desired value. Because the physical effects of the environment, such as voltage being provided, temperature of the component, for example, can affect the operation of the latch, there is often a large margin used to operate them. These large margins avoid errors but decrease overall speed of the interface. By utilizing a test latch within an interface bus group with a drop in operating voltage, changes in output detected can be indicative of upcoming errors. Once detected, the error can be remedied by increasing voltage, lowering operating speeds, or cooling the components.

20 Claims, 7 Drawing Sheets

INTERFACE BUS SPEED OPTIMIZATION

FIELD

The present disclosure relates to storage systems. More particularly, the present disclosure relates to increasing interface bus speed between components of a storage device by generating an accurate early warning failure signal and remedying the detected failure.

BACKGROUND

During operation of a data storage device, data may be communicated between a controller and a memory of the data storage device via a data bus that couples the controller and the memory. For example, one or more data values may be provided to or received from the data bus at a transfer rate based on a frequency of a clock signal. To illustrate, a first data value may be provided to the data bus from the controller in response to a rising edge of the clock signal. As another example, a second data value may be received from the data bus and stored at the controller in response to a falling edge of the clock signal.

A data storage device may be designed to have a fixed clock frequency that allows sufficient setup and hold times to enable reliable transmission and sampling of data over a bus interface between integrated circuits (e.g., a controller and a non-volatile memory). Typically, large margins are provided with respect to the clock frequency to account for worst-case scenarios (e.g., worst-case silicon process speed, system voltage, and system temperature (PVT) conditions) that may occur during operation of the data storage device. Setting the clock frequency (e.g., a data transfer rate) to the fixed value may avoid errors that may occur if the data transfer rate is too high in such worst-case scenarios. However, by operating the data storage device (e.g., the bus) at a clock frequency based on the worst-case scenarios, a data transfer rate (e.g., a bus speed) may be significantly lower than a theoretical maximum data transfer rate of the bus.

BRIEF DESCRIPTION OF DRAWINGS

The above, and other, aspects, features, and advantages of several embodiments of the present disclosure will be more apparent from the following description as presented in conjunction with the following several figures of the drawings.

Figure 1:
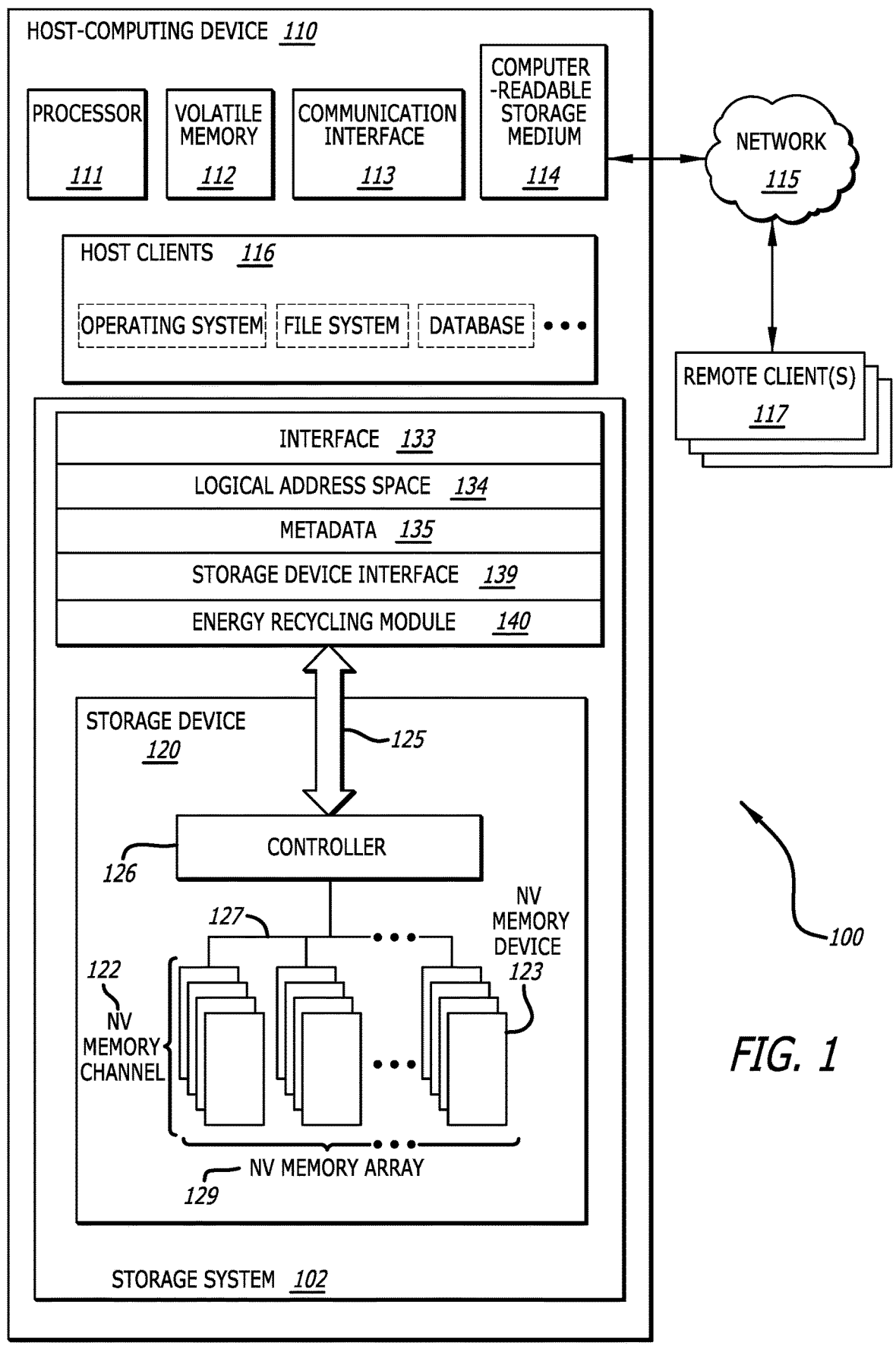
FIG. 1 is a schematic block diagram of a host-computing device with a storage system suitable for optimizing interface bus speeds in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that can generate an accurate detection of potential errors in latch operations and generate a plurality of remedial actions to correct those potential errors before they appear in operational data. In many embodiments, each plurality of components utilized for bus interface data transfers, such as but not limited to latches, may include an additional test component or latch that is similar. This similarity can, for example, be that the component is the same type, make, and/or model as the components utilized in the interface bus group. Additionally, the test component can be placed directly adjacent to the interface bus group components as to be within the same thermal zone. This can be critical in response to certain errors that are due to increased temperature within the device and/or components.

In further embodiments, the test component (e.g., latch) can be feed from the exact same clock and data source inputs as at least another of the group of interface bus group components. In this way, the test component may generate a very similar output. However, in a number of embodiments, the test component also has a voltage drop placed on the power input. As those skilled in the art will recognize, many test components, such as latches, operate better when they are supplied a higher voltage. Of course, providing increased power limits power saving goals and is therefore not always available or suitable as an option. Ideally, many manufacturers would prefer to provide as little power as possible to the interface components in order to limit the overall power draw of the device. However, if the power is lowered too much, errors within data transmission of the interface bus may occur. By utilizing a voltage drop to a test component, such as a latch, the output can be monitored to determine if an error occurs in the test component prior to an actual error occurring in the bus interface group of components.

By determining and utilizing these warning errors from test components, bus speeds may be increased until the test errors are detected. This increase in bus speed may be static and based on specific component operations within each specific device during manufacture. However, the bus speed increase may be dynamically changed based on various factors such as, but not limited to, interface importance or priority, the type of data being transmitted, the current environmental conditions of the components, and/or the availability of providing increased power to the interface components.

The ability to detect errors in the output of the test components can be accomplished in a variety of ways. In some embodiments, the output of the test components and at least one of the plurality of interface bus components are fed into a comparator. The comparator can be configured to receive both signals from the test and non-test components to determine if both signals are identical (or at least within a predetermined tolerance). When a difference between the two signals is detected, the comparator can generate a signal indicating that a change has occurred. Often, since the comparator is looking for a disagreement between the signals of the two components, any generated signal can be assumed to stem from a change or error in the operation of the test component.

In further embodiments, the comparator can include an exclusive NOR (XOR) logic gate. An XOR gate can be configured to accept a binary input of either a high or low signal from two sources. The high or low signal can correspond to ones and zeros of the data being transmitted or otherwise processed by the interface bus. When the XOR gate receives two identical inputs, the output of the XOR logic gate is at one level. However, when one of the input signals differs from the other, then the XOR gate outputs a signal at a different level. This different level can be fed into one or more logics that can be configured to react and process this signal as an error being generated by the test component.

Previous methods often attempted to produce an error within a test component by delaying the incoming data compared to the non-test component(s). However, methods described herein allow for a more accurate representation of a data-processing error as the test component, or latch, is allowed to receive and process data similarly to a non-test component. However, by receiving a voltage drop, the limits of the particular kind of test component become more apparent. For example, voltages provided to interface bus components can change over time. The power is often received from a power supply but may often be dynamically managed by a power management component or logic. Thus, voltage drops, which could not be previously accounted for, can now be utilized to determine a more accurate limit for suitable bus speeds.

Additionally, when errors are determined in the one or more test component(s), various embodiments described herein can execute various remedial actions indented to correct the error in the test component before they occur in the non-test components. As previously mentioned, increased power to latches can increase their operational abilities. Many devices operate with a power management system that can dynamically change power supplied to various components. In this way, in response to a detected error, certain embodiments can generate and transmit a signal to the power management logic to increase the power supplied to the interface bus components. This can be done over discrete amounts/cycles until the error is resolved.

However, there may be instances when increased voltage is not available or realistic to provide to the interface components. In some embodiments, in response to this, one or more cooling activities may be activated or increased. In some devices, fans or other temperature transfer systems may be utilized. These cooling systems can be system-wide or may be configured to operate within particular zones or on certain components within the device. Because the test component(s) are often located within the same thermal zone as the non-test component(s) in many embodiments, even cooling in a small area of the device related to the bus speed interface components can rectify the error determined by the comparator.

Remedial actions may include lowering the clock speed (bus speed) of the interface. By lowering the clock speed, the interface components (including the test component) will have more time to satisfy any setup and/or hold requirements that were not previously being met. However, in some embodiments or situations, it may not be possible to lower clock speeds because of some hardware limitation or because there is a minimum requirement needed for the interface operation. In some embodiments that cannot execute any remedial action, the operation of the interface and/or the device itself is halted to avoid any errors occurring on the interface bus.

Throughout this disclosure, reference is made to a plurality of latches and interface bus test latches and/or data latches. While reference is often made to latches, it is contemplated that other components may be utilized depending on the application desired. Reference to latches is not limiting to simply that component, but may be any component that can receive data and transfer it over an interface bus.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device with a storage system suitable for optimizing interface bus speeds in accordance with an embodiment of the disclosure is shown. The bus speed optimization system 100 may comprise one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network 115, such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a communication network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer-readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote clients 117 accessible via the network 115 and/or communication interface 113. The host clients 116 may include, but are not limited to: operating systems, file systems, database applications, server applications, kernel-level processes, user-level processes, applications, and the like.

In many embodiments, the host-computing device 110 can include a plurality of virtual machines which may be instantiated or otherwise created based on user-request. As will be understood by those skilled in the art, a host-computing device 110 may create a plurality of virtual machines configured as virtual hosts which is limited only on the available computing resources and/or demand. A hypervisor can be available to create, run, and otherwise manage the plurality of virtual machines. Each virtual machine may include a plurality of virtual host clients similar to host clients 116 that may utilize the storage system 102 to store and access data.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote clients 117 (which can act as another host). The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

The storage system 102 may also include an energy recycling module 140. In various embodiments, the energy recycling module 140 may be disposed within a storage system, such as the embodiment depicted in FIG. 1. However, it is contemplated that many embodiments comprise at least one energy recycling module 140 disposed within the storage device 120 itself. As described in further detail below, the energy recycling module can be configured to capture excess heat and generate electricity that can be stored or utilized to power other components within the storage device 120 and/or storage system 102. The energy recycling module 140 may also be configured to operate in a cooling mode that can receive a power supply and cool one or more surfaces of various components within the storage device 120 or storage system 102. It should also be noted that the energy recycling module 140 may be similar to the energy recycling modules discussed throughout this disclosure such as those described in FIGS. 2-10.

Figure 2:
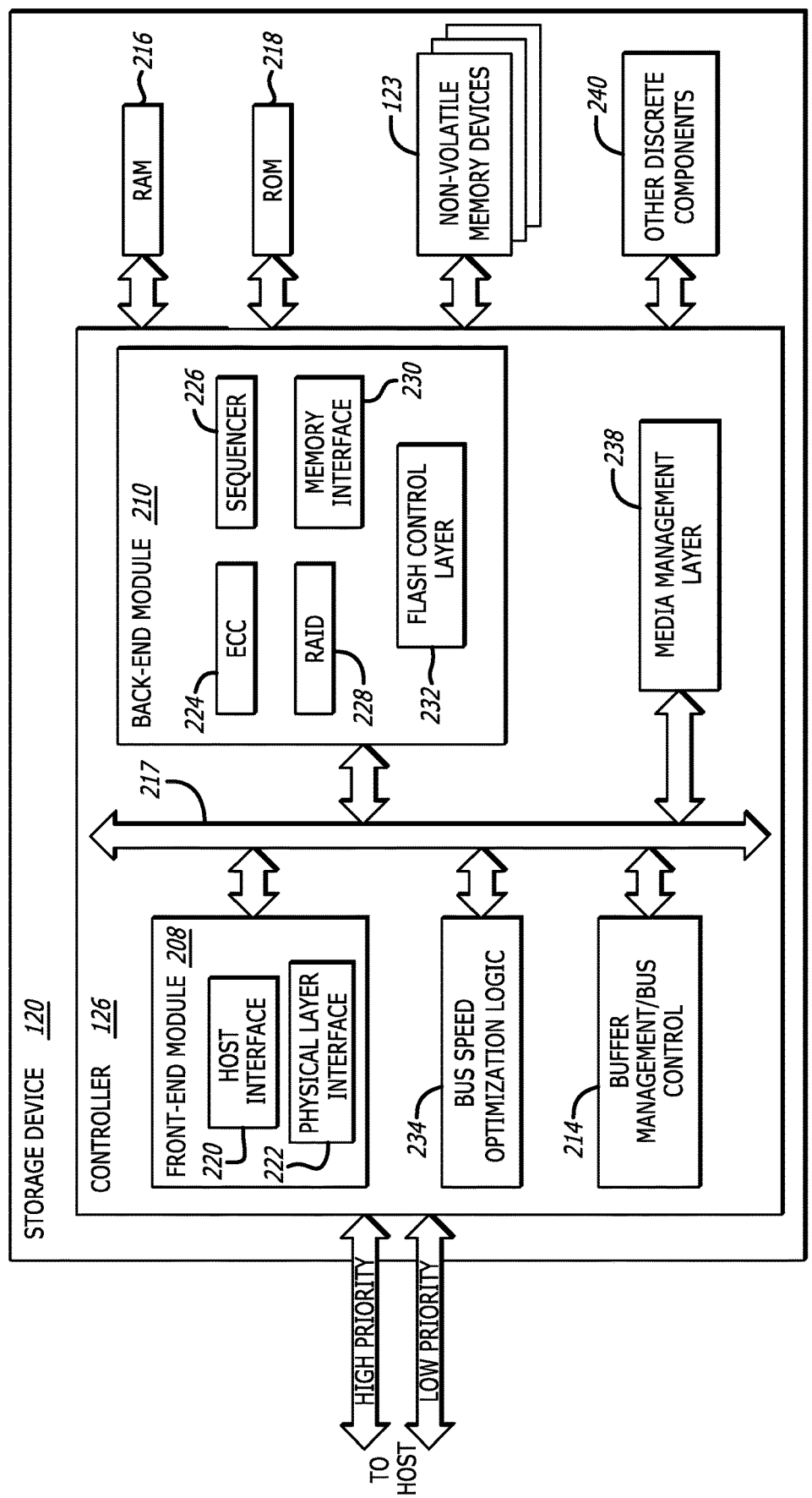
FIG. 2 is a schematic block diagram of a storage device suitable for optimizing interface bus speeds in accordance with an embodiment of the disclosure.

Referring to FIG. 2, a schematic block diagram of a storage device suitable for optimizing interface bus speeds in accordance with an embodiment of the disclosure is shown. The controller 126 may include a front-end module 208 that interfaces with a host via a plurality of high priority and low priority communication channels, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as energy recycling modules, external electrical interfaces, external RAM, resistors, capacitors, or other components that may interface with controller 126. In alternative embodiments, one or more of the RAID modules 228, media management layer 238 and buffer management/bus control module 214 are optional components that may not be necessary in the controller 126.

Finally, the controller 126 may also comprise a bus speed optimization logic 234. In many embodiments, the bus speed optimization logic 234 can be configured to program or otherwise set the voltage drop associated with the test latch(es). The setting of the voltage drop can be dynamically changed based on a variety of factors. These factors may be monitored by the bus speed optimization logic 234 which can then adjust the voltage drop as necessary. Additionally, in certain embodiments, the bus speed optimization logic 234 can monitor the output of the comparator (or act as a comparator) and determine if an error is present and generate any necessary signals to remedy those errors, such as, but not limited to, increasing the power supplied to the interface bus group components, notifying a power management logic, increasing the cooling to the components, or lowering the clock frequency speed of the interface.

Figure 3:
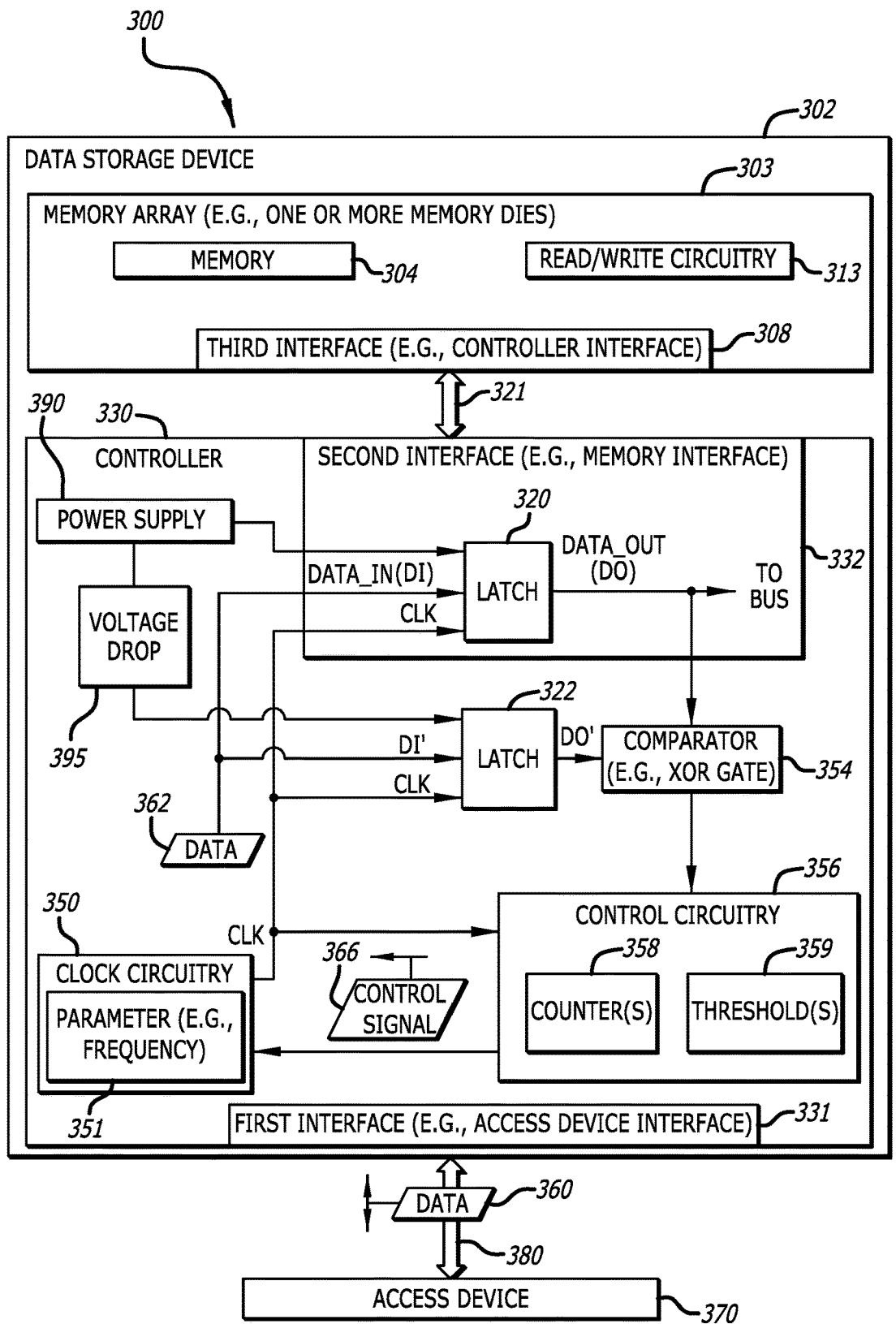
FIG. 3 is a block diagram of a data storage device operable to adjust a speed of an interface bus in accordance with an embodiment of the disclosure.

Referring to FIG. 3, a block diagram of a data storage device operable to adjust a speed of an interface bus in accordance with an embodiment of the disclosure is shown. The embodiment depicted in FIG. 3 is of a system 300 that includes a data storage device 302 and an access device 370. The data storage device 302 can includes a controller 330 and a memory array 303 that is coupled to the controller 330. The memory array 303 may include one or more memory dies, arrays, or other configurations of memory devices. It should be understood that the data storage device 302 of FIG. 3 may be similar to the storage device 120 of FIGS. 1 and 2. Similarly, the access device 370 may also be analogous to the host-computing device 110 of FIG. 1, while the memory array 303 can be similar to the memory array 130 of FIGS. 1 and 2.

The data storage device 302 and the access device 370 may be coupled via a connection (e.g., a communication path 380), such as a bus or a wireless connection to transmit data 360. The data storage device 302 may include a first interface 331 (e.g., an access device interface) that enables communication via the communication path 380 between the data storage device 302 and the access device 370.

In some implementations, the data storage device 302 may be attached to or embedded within one or more access devices, such as within a housing of the access device 370. For example, the data storage device 302 may correspond to a memory card or solid-state disk drive. To further illustrate, the data storage device 302 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In further embodiments, the data storage device 302 may be implemented in a portable device configured to be selectively coupled to one or more external access devices. For example, the data storage device 302 may be removable from the access device 370 (i.e., "removably" coupled to the access device 370). As an example, the data storage device 302 may be removably coupled to the access device 370 in accordance with a removable universal serial bus (USB) configuration. In still other implementations, the data storage device 302 may be a component of a network accessible data storage system, such as an enterprise data system, a network-attached storage system, a cloud data storage system, etc.

In some implementations, the data storage device 302 may include interfaces for accessing or transferring data as a to a solid state drive (SSD) which may be included in, or distinct from (and accessible to), the access device 370. For example, the data storage device 302 may include or correspond to an SSD, which may be used as an embedded storage drive (e.g., a mobile embedded storage drive), an enterprise storage drive (ESD), a client storage device, or a cloud storage drive, as illustrative, non-limiting examples. In some embodiments, the data storage device 302 can be coupled to the access device 370 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 302 may be a network-attached storage (NAS) device or a component (e.g., a solid-state drive (SSD) device) of a data center storage system, an enterprise storage system, or a storage area network.

The access device 370 may include a memory interface (not shown) and may be configured to communicate with the data storage device 302 via the memory interface to read data from and write data to the memory array 303 of the data storage device 302. For example, the access device 370 may operate in compliance with a Joint Electron Devices Engineering Council (JEDEC) industry specification, such as a Universal Flash Storage (UFS) Access Controller Interface specification. As other examples, the access device 370 may operate in compliance with one or more other specifications, such as a Secure Digital (SD) Access Controller specification, as an illustrative, non-limiting example. The access device 370 may communicate with the memory array 303 in accordance with any other suitable communication protocol.

The memory array 303 may include support circuitry, such as read/write circuitry 313, to support operation of one or more memory dies of the memory array 303. Although depicted as a single component, the read/write circuitry 313 may be divided into separate components of the memory array 303, such as read circuitry and write circuitry. The read/write circuitry 313 may be external to the one or more dies of the memory array 303. Alternatively, one or more individual memory dies of the memory array 303 may include corresponding read/write circuitry that is operable to read data from and/or write data to storage elements within the individual memory die independent of any other read and/or write operations at any of the other memory dies.

In many embodiments, the memory array 303 can be coupled to the controller 330 via a bus 321 (e.g., a data bus). For example, the controller 330 can include a second interface 332 (e.g., a memory interface) that is coupled to a third interface 308 (e.g., a controller interface) of the memory array 303. The bus 321 may include one or more channels to enable the controller 330 to communicate with a plurality of memory devices at once. As another example, the bus 321 may include multiple distinct channels to enable the controller 330 to communicate with memory devices in parallel with, and independently of, communication with other memory dies of the memory array 303.

Various interface can be used through the system 300. For example, the controller 330 may send data to the access device 370 via the first interface 331, and the controller 330 may receive data from the access device 370 via the first interface 331. The controller 330 is configured to send data and commands to the memory 304 and to receive data from the memory 304. For example, the controller 330 is configured to send data and a write command to cause the memory 304 to store data to a specified address of the memory 304. The write command may specify a physical address of a portion of the memory 304 (e.g., a physical address of a word line of the memory 304) that is to store the data. The controller 330 may also be configured to send data and commands to the memory 304 associated with background scanning operations, garbage collection operations, and/or wear leveling operations, etc., as illustrative, non-limiting examples. The controller 330 is configured to send a read command to the memory 304 to access data from a specified address of the memory 304. The read command may specify the physical address of a portion of the memory 304 (e.g., a physical address of a word line of the memory 304).

The controller 330 may also include a second interface 332 (e.g., a data bus interface including a first latch 320 and configured to be coupled to the bus 321), a second latch 322, clock circuitry 350, a delay element 352, a comparator 354, and control circuitry 356. The clock circuitry 350 is often configured to generate a clock signal Clk. In a variety of embodiments, the clock signal Clk can be provided to the first latch 320 and the second latch 322. The clock circuitry 350 may include a parameter 351 that may be dynamically adjusted during operation of the data storage device 302. In a particular implementation, the parameter 351 indicates a value of a frequency of the clock signal Clk generated by the clock circuitry 350.

As shown in the embodiment of FIG. 3, the first latch 320 can be configured to be coupled to the bus 321 (e.g., a data bus). In some implementations, the first latch 320 comprises a flop-flop. The first latch 320 is configured to receive a data signal (e.g., Data_In (DI)) corresponding to data 362. The first latch 320 is also configured to receive the clock signal Clk. The first latch 320 is configured to generate a first output (e.g., Data_Out (DO)) responsive to the clock signal Clk and the data signal DI. The first output of the first latch 320 is provided to the bus 321 and to the comparator 354. The speed of the first latch 320 (e.g., a speed of the interface 321) may be dictated by setup and hold time requirements, which may depend on the silicon PVT (Silicon Process speed, System Voltage and System Temperature) conditions of the data storage device 302.

In various embodiments, the second latch 322 is coupled to a voltage drop 395 that lowers the available voltage provided by the power supply 390. As discussed previously, the lower voltage may create setup and hold issues sooner in the second latch 322 than the first latch 320. In certain embodiments, the voltage drop 395 can be dynamically configured by one or more logics. By understanding when the limits of the voltage levels and upcoming errors, the bus speed/clock frequency can be increased past normal limits. An illustrative example of a timing diagram depicting latch inputs, latch outputs, and a clock signal is described herein with reference to FIG. 2.

The comparator 354 is coupled to the first latch 320 and to the second latch 322 and is configured to receive the first output DO from the first latch 320 and the second output DO' from the second latch 322. In many embodiments, the comparator 354 can be further configured to output an indication of whether the first output DO matches (e.g., is the same as) the second output DO'. As an illustrative, non-limiting example, the comparator 354 may output a logical 0 value if the first output DO and the second output DO' match and, alternatively, may output a logical 1 value if the first output DO does not match the second output DO'. An indication output by the comparator 354 that the first output DO and the second output DO' do not match may correspond to the first latch 320 being at risk of a setup/hold violation. In some implementations, the comparator 354 is configured as an exclusive OR (XOR) logic gate.

In additional embodiments, control circuitry 356 can be coupled to the comparator 354 and configured to receive an output of the comparator 354. The control circuitry 356 may include one or more counters 358 and one or more thresholds 359. The one or more counters 358 may count a number of consecutive clock cycles of an evaluation time period in which the output of comparator 354 indicated that the first output DO matched the second output DO', a number of consecutive clock cycles in which the output of comparator 354 indicated that the first output DO did not match the second output DO', a number of clock cycles (during a time period) in which the output of comparator 354 indicated that the first output DO and the second output DO' matched, a number of clock cycles (during the time period) in which the output of comparator 354 indicated that the first output DO and the second output DO' did not match, or a combination thereof. The one or more thresholds 359 may include a variety of thresholds such as, but not limited to, maximum allowed clock frequency which can be considered a stability threshold associated with a number of clock cycles in which the output of comparator 354 indicated that the first output DO and the second output DO' matched, an instability threshold associated with a number of clock cycles in which the output of comparator 354 indicated that the first output DO and the second output DO' did not match, or a combination thereof.

The control circuitry 356 may be configured to determine whether to adjust (or maintain) an operating parameter, such as the parameter 351 (e.g., a frequency of the clock signal Clk), voltage output of the power supply 390, or any cooling parameters based on an output of the comparator 354. To illustrate, the control circuitry 356 may be configured to sample the output of the comparator 354 based on the clock signal Clk and determine whether to adjust the operating parameter based on the sampled output. In some implementations, the control circuitry 356 may sample the output of the comparator 354 every clock cycle. For example, the control circuitry 356 may sample the output of the comparator 354 responsive to a transition of the clock signal Clk, such as a transition from low to high or from high to low. In some implementations, the control circuitry 345 may sample the output of the comparator 354 on based a different transition (of the clock signal Clk) from a transition of the clock signal Clk a that controls the latches 320, 322. For example, if the latches 320, 322 are configured to operate responsive to a transition of the clock signal Clk from low to high, the control circuitry 356 may sample the output of the comparator 354 responsive to the clock signal transitioning from high to low. Because effects of PVT changes may occur over a period of time, in other implementations, the control circuitry 356 may sample the output of the comparator 354 randomly or periodically.

During operation of the data storage device 302, the data 362 is provided as Data_In DI to the first latch 320. The data 362 is also provided to the second latch 322. The clock signal circuitry 350 provides the clock signal Clk to the first latch 320 and the second latch 322. A transition of the clock signal Clk, such as a transition from low to high, may cause the first latch 320 to provide a first output (e.g., Data_Out (DO)) and causes the second latch 322 to provide a second output (e.g., DO'). The first output DO is provided to the bus 321 and to the comparator 354. The second output is provided to the comparator 354, although other pathways are contemplated in additional embodiments.

If the output of the comparator 354 indicates that the first output DO and the second output DO' do not match, the control circuitry 356 may be configured in various embodiments to reduce a frequency of the clock signal Clk generated by the clock circuitry 350 increase the power provided by the power supply 390, or request increase cooling processes to occur. To adjust the frequency, the control circuitry 356 may generate a control signal 366 and send the control signal 366 to the clock circuitry 350. In some implementations, the control circuitry 356 may determine to reduce the frequency of the clock signal Clk in response to a threshold number of clock cycles in which the first output DO and the second output DO' do not match. As another example, the control circuitry 356 may determine to increase the frequency of the clock signal Clk generated by the clock circuitry 350 in response to determining that the first output DO and the second output DO' match.

The control circuitry 356 may take the form of a packaged functional hardware unit designed for use with other components, a portion of a program code (e.g., software or firmware) executable by a (micro)processor or processing circuitry, or a self-contained hardware or software component that interfaces with a larger system, as illustrative, non-limiting examples. Although the control circuitry 356 is described herein as being separate from the comparator 354, in other implementations, the comparator 354 may be included in the control circuitry 356 in certain embodiments. In response to receiving the control signal 366, the clock circuitry 350 may increase, decrease, or maintain a value of the parameter 351 (e.g., the frequency of the clock signal Clk, or the voltage provided by the power supply 390, etc.).

In further embodiments, the comparator 354 can be configured to receive the first output and the second output and determine whether the first output and the second output are the same, e.g., the first output and the second output correspond to the same logical value. In many embodiments, if the first output and the second output are the same, the comparator 354 generates a signal having a first value indicating that the first and second outputs are the same. Conversely, if the first output and the second output are different, the comparator 354 can generate a signal having a second value that indicates the first and second outputs are different, which can be correlated to an impending error and/or setup/hold violation on the data bus data transmission. The comparator 354 can be configured to send the indication to the control circuitry 356.

In a number of embodiments, the control circuitry 356 can be configured to determine whether to adjust one or more operating parameters of the data storage device 302 based on a value of an indication. For example, the control circuitry 356 may determine to adjust one or more operating parameters in response to the value of the indicator corresponding to a risk of a setup/hold violation. In one embodiment, the control circuitry 356 may determine to reduce a frequency of the clock signal Clk generated by the clock circuitry 350. To adjust the one or more parameters, the control circuitry 356 may generate a control signal 366. To adjust the frequency of the clock signal Clk or the power supply level for example, the control circuitry 356 may send the control signal 366 to the clock circuitry 350, or another component capable of taking a remedial action to correct the comparator output. In still further embodiments, the control circuitry 356 may determine to increase or decrease a power supply voltage supplied to the first latch 320 and the second latch 322. To increase or decrease the power supply voltage, the control circuitry 356 may send the control signal 366 to a power supply or other power management integrated circuit (PMIC) of the data storage device 302.

Although the first latch 320 is described as providing the first output DO to the bus 321, in alternative embodiments, the first latch 320 (and the second latch 322) may receive data from the bus 321 at an input of the first latch 320 (and at an input of the second latch 322). When the first latch 320 receives the data from the bus 321, the first latch 320 may be configured to provide the first output DO to one or more components of the controller 330. Furthermore, the second interface 332 is described as including a single latch (e.g., the first latch 320), the first latch 320 may be representative of multiple latches included in the second interface 332.

Each latch of the plurality of latches may be coupled to different a channel of the bus 321. In some implementations, the second interface 321 may include a first set of latches configured to be used to send data to the memory array 303 via the bus 321 and a second set of latches configured to be used to receive data from the memory array 303 via the bus 321.

In some implementations, the one or more counters 358 and/or the one or more thresholds 359 may be stored at the memory 304. In other implementations, the controller 330 may include or may be coupled to a particular memory, such as a random access memory (RAM), that is configured to store the one or more counters 358 and/or the one or more thresholds 359. Alternatively, or in addition, the controller 330 may include or may be coupled to another memory (not shown), such as a non-volatile memory, a RAM, or a read only memory (ROM). The other memory may be a single memory component, multiple distinct memory components, and/or may include multiple different types (e.g., volatile memory and/or non-volatile) of memory components. In some implementations, the other memory may be included in the access device 370.

Figure 4:
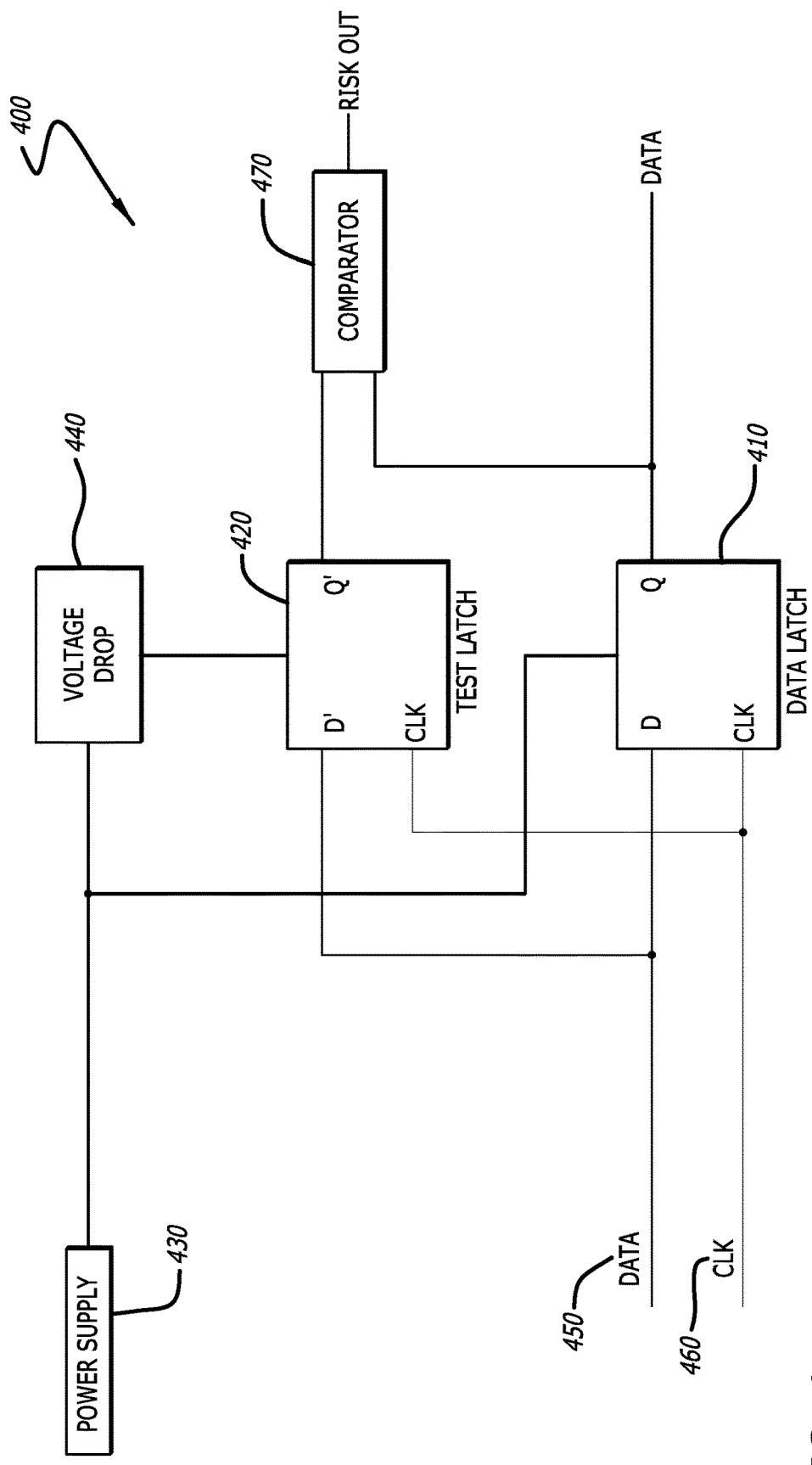
FIG. 4 is a block diagram of a device suitable for optimizing an interface bus in accordance with an embodiment of the disclosure.

Referring to FIG. 4, a block diagram of a device suitable for optimizing an interface bus in accordance with an embodiment of the disclosure is shown. In many embodiments, the bus speed optimization system 400 may include at least a pair of latches, comprising a data latch 410 and a test latch 420. Typically, the data latch 410 is configured as part of a plurality of data latches within an interface bus. In further embodiments, the test latch 420 is a latch is located within the same thermal zone as the data latch 410 and is often the same make/model of the data latch 410 to increase the likelihood of similar outputs given the current condition of the interface bus and surrounding environment.

Both the data latch 410 and the test latch 420 can be fed data to an input from the same data line 450. Similarly, a single clock signal 460 can be provided to both the data latch 410 and test latch 420. Additionally, power is supplied from a power supply 430 to each latch 410, 420. However, the power line feeding the test latch 420 can include a voltage drop 440 that provides a second voltage lower than the regular voltage provided by the power supply 430. The voltage drop 440 can be a static value, in some embodiments implemented via a resistor placed on the power line. In these embodiments, the voltage drop 440 would be a relative difference and would scale with the current voltage being provided by the power supply 430. However, in further embodiments, the voltage drop 440 can be dynamically changed via a component such as for example, a variable resistor.

In additional embodiments, the output of both the data latch 410 and test latch 420 are fed into a comparator 470 which can be configured to generate a signal that indicates the risk of a setup and/or hold violation (notated as "risk out" in FIG. 4). As previously discussed, certain embodiments may utilize an exclusive NOR logic gate (i.e., an XOR logic gate). The XOR gate can indicate risk by outputting a first signal (high or low) when both the data latch 410 and test latch 420 output the same signal, and then outputting an opposing second signal when one of the two latches 410, 420 output differ. The risk output from the comparator 470 can then be utilized to execute one or more remedial actions to try and correct the error detected within the test latch 420.

Figure 5:
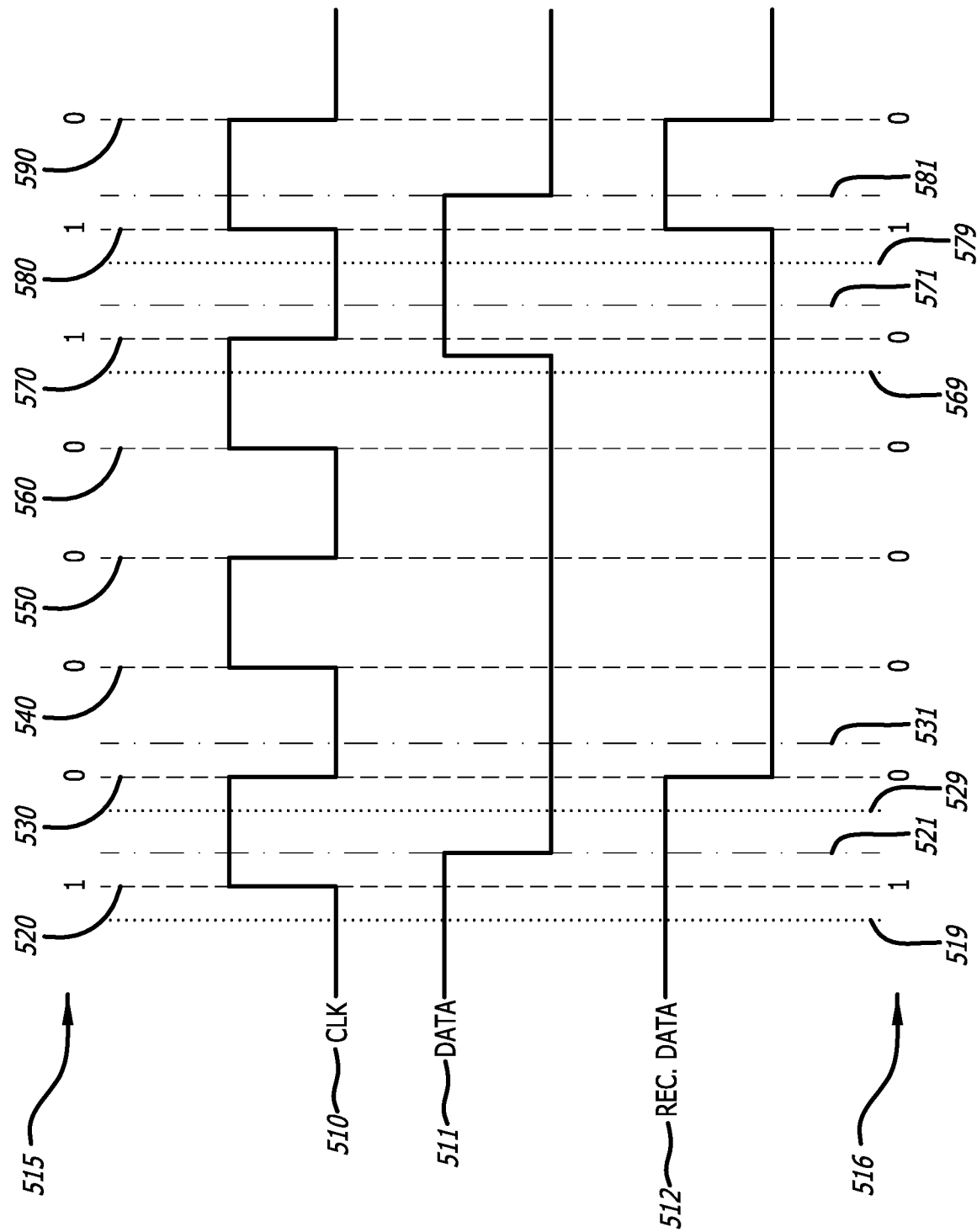
FIG. 5 is a timing diagram depicting example setup and hold cycles within a storage device in accordance with an embodiment of the disclosure.

Referring to FIG. 5, a timing diagram depicting example setup and hold cycles within a storage device in accordance with an embodiment of the disclosure is shown. In many embodiments, the interface utilizes components that receive and/or transfer a signal that is received as an input. Within the timing diagram, this is represented as a data signal 511 that represents a string of binary numbers. In the embodiment depicted in FIG. 5, the specific input data stream 515 is 10000110. To transfer this data across an interface, the component can synchronize the moment the input data stream 515 Atis to be read as occurring on a rising or falling edge of a clock signal such as the clock signal 510 depicted in FIG. 5. At the moment of a rising edge 520, 540, 560, 580 or falling edge 530, 550, 570, 590 of the clock signal 510.

However, physical components are often subject to limitations on their operation. For example, latches cannot read data instantly and instead require the desired signal to be set for a specific period of time. In many embodiments, the period of time require prior to the rising or falling edge 520-590, is called a setup time, while the time required for the signal to remain after the rising or falling edge 520-590 is often called a hold time. Each type, make, or model of latch may have a specific setup and/or hold time associated with them. Furthermore, various environmental conditions may affect the setup and hold limits such as the current temperature of the component, and/or the amount of power provided to the component.

The timing diagram depicted in FIG. 5 includes a first setup threshold 519 and first hold threshold 521 associated with a first rising signal edge 520. For the latch to correctly transfer a signal representative of the received data signal, the data signal 511 should be set to the correct level at or before the first setup threshold 519 and hold the value until the first hold threshold 521 has expired. In the depicted embodiment of FIG. 5, the data signal 511 is set to a high signal to indicate a 1 value prior to the first setup threshold 519 and is held at that value. The value is not changed until the first hold threshold 521 has been reached.

Likewise, the first falling edge 530 of the clock signal 510 indicates another opportunity to transfer data across an interface. The data signal 511 has changed from a high signal "1" to a low "0" signal. This transition occurred prior to the second setup threshold 529 and extends throughout the next few clock edges, easily passing the second hold threshold 531. Thus, the low data signal 511 is correctly transferred as indicated by the received data signal 512 at the first falling edge 530.

However, during the data transfer of the third falling edge 570, the data signal 511 fails to change to a high "1" signal until after the setup threshold 569 has occurred. In this embodiment, because the signal was not adjusted prior to the setup threshold 569, the received data 512 is incorrect and is received as a low "0" signal instead of the intended high "1" signal. Subsequently, the data signal 511 remains in the high state through the hold threshold 571 and through the following setup threshold 579 and hold threshold 581 associated with the fourth rising edge 580 of the clock signal 510. Thus, the received data 512 is adjusted to a high "1" signal as intended from the original data signal 511.

Ultimately, the input data stream 515 of 10000110 is not faithfully transferred over this exemplary interface as the output data stream 516 will read as 100000010, indicating an error in the $6^{th}$ bit. As shown in FIG. 5, the setup and hold thresholds of various interface components can lead to errors in transferring data. Thus, in order to avoid getting close to these thresholds, many manufacturers slow down the clock signal 510 frequency such that every interface component can have sufficient time to operate normally. However, by utilizing various embodiments described herein, the clock signal 510 can be configured to increase frequency until a test latch generates an error, indicating that one or more setup and/or hold thresholds have been violated, indicating that actual data errors may occur if remedial actions are not taken.

Figure 6:
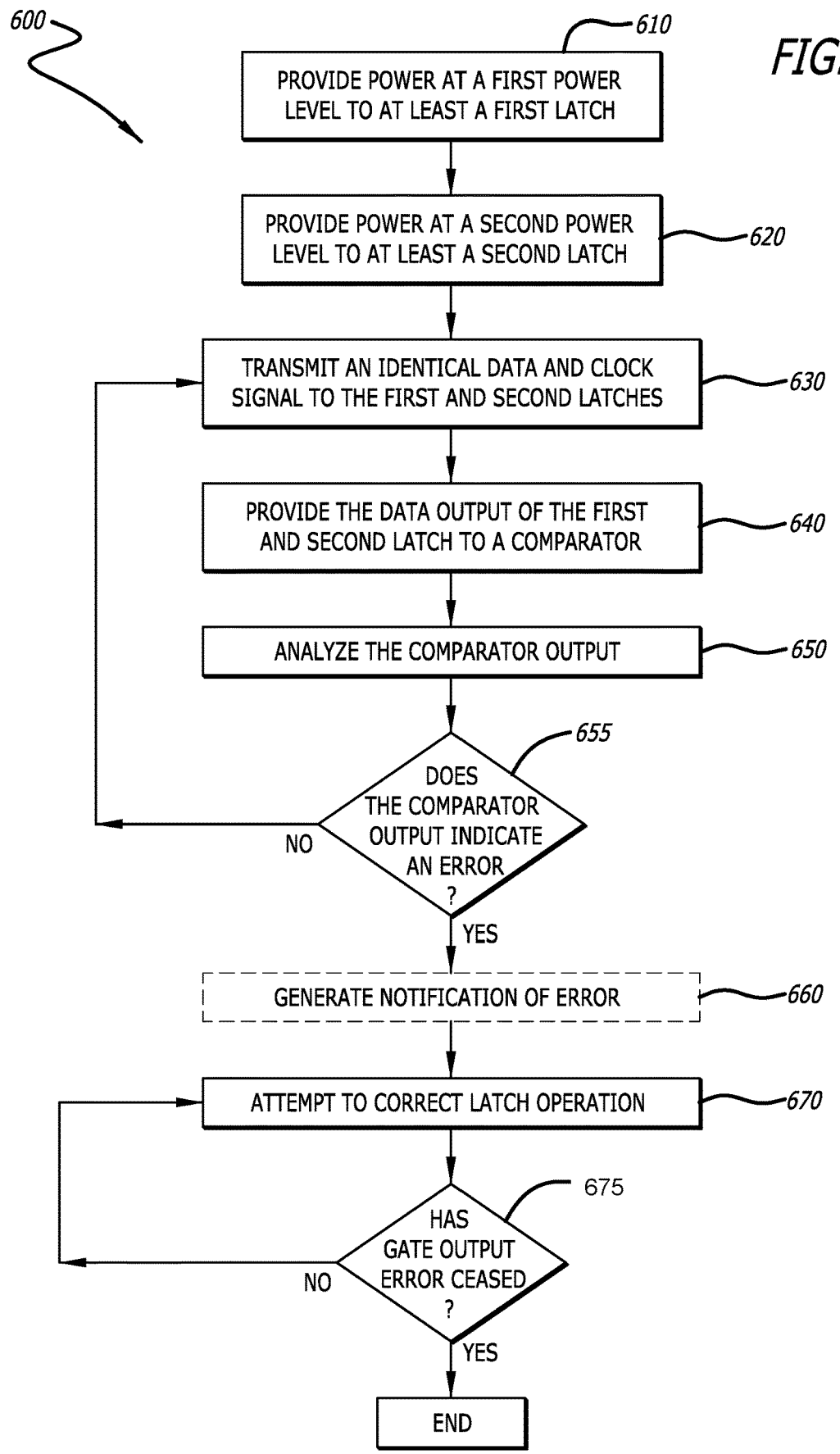
FIG. 6 is a flowchart depicting a process for detecting and correcting latch operations in accordance with an embodiment of the disclosure.

Referring to FIG. 6, a flowchart depicting a process for detecting and correcting latch operations in accordance with an embodiment of the disclosure is shown. In many embodiments, the process 600 can provide power at a first power level to at least a first latch (block 610). As discussed previously, storage devices may be configured with a variety of interfaces and associated components. These interface components can be grouped together into bus groupings to transmit larger amounts of data in a shorter amount of time.

The process 600 can further provide power at a second power level to at least a second latch (block 620). In a number of embodiments, the second latch is an additional interface component within a bus grouping. In these embodiments, this second latch may act as a test latch by receiving a lower amount of power compared to the first latch and first power level.

Once configured, the process 600 can transmit an identical data and clock signal to the first and second latches (block 630). Although embodiments described herein with respect to FIG. 6 describe a first and second latch, other configurations are contemplated that may utilize multiple test latches and compare against multiple latches operated at a first power level.

In a variety of embodiments, the process 600 can provide the data output of the first and second latch to a comparator (block 640). Often, the comparator is an exclusive NOR (XOR) logic gate. In this way, the signal output from the comparator is at a first level when both data inputs from the first and second latch are equal. However, when the data output of the first and second latch differ, the comparator outputs a second signal level indicating a change. This change can be interpreted and acted upon as a potential setup and/or hold violation that can result in data errors if no remedial actions are taken.

The process 600 can analyze the comparator output to determine the potential for these setup/hold violations (block 650). Often, this analysis is monitoring the output signal level of the comparator. A change in high to low voltage or example, can be used to determine error. The process 600 can do this determination for verifying if an output indicates as error or normal operations (block 655). When no errors are detected the process 600 can continue to transmit identical data and clock signals to each latch or interface component (block 630).

However, in certain embodiments, the process 600 can generate a notification of an error when one is determined to exist (block 660). This notification be made to one or more other components within the storage device or may be sent externally to other devices with a host-computing device or other remote device. When the error is determined, the process 600 can also attempt to correct the latch operation (block 670). In many embodiments, this is done via executing one or more remedial actions, such as those discussed below with reference to FIG. 7.

Once the attempt to correct has occurred, the process 600 can determine if the gate output error (e.g., the comparator output) has ceased (block 675). If an error still appears to be present, the process can continue to attempt to correct the latch operation (block 670). However, when the gate output error is determined to have stopped, the process 600 can end.

Figure 7:
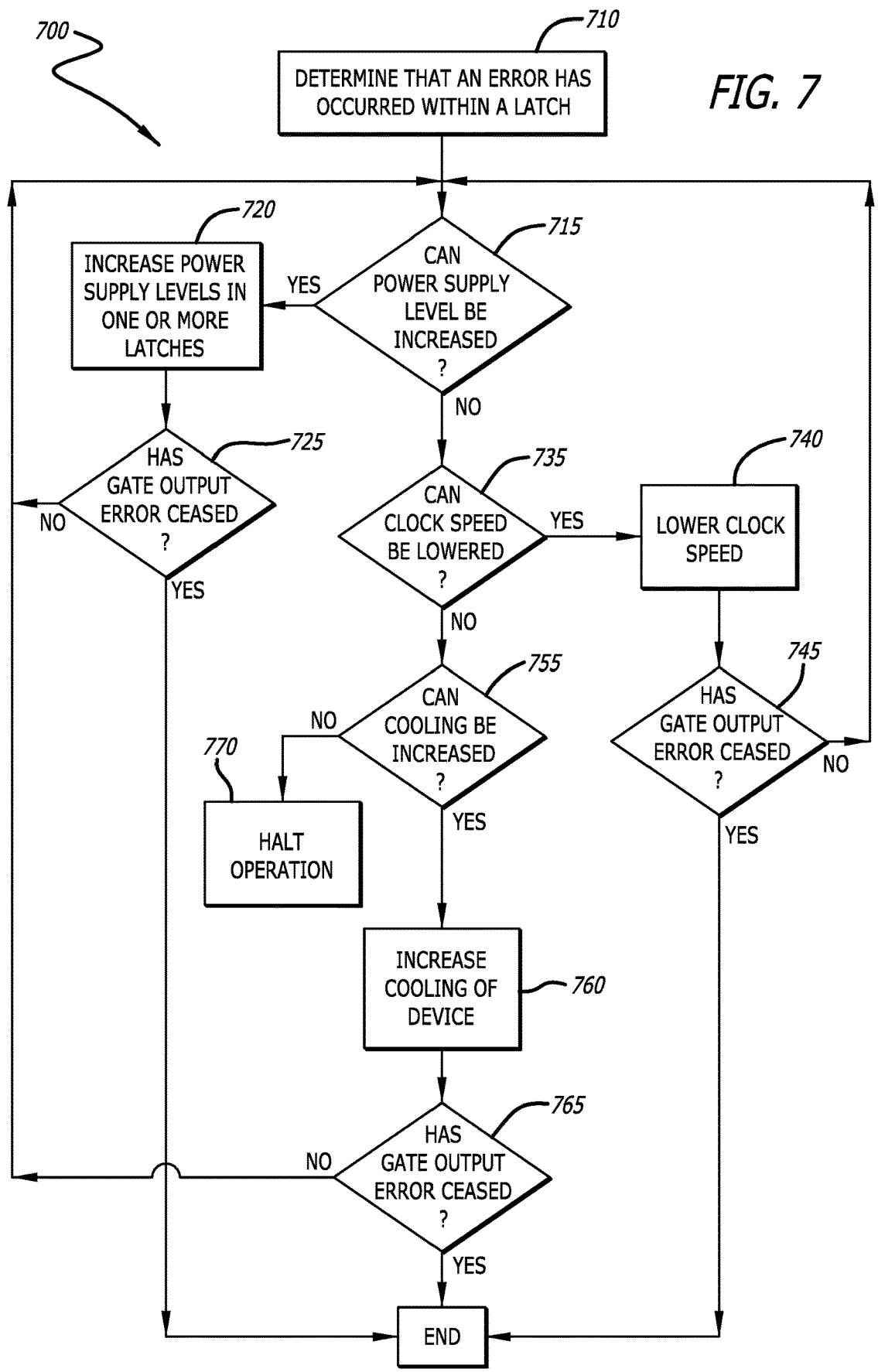
FIG. 7 is a flowchart depicting a process for enacting various remedial actions to correct latch operations in accordance with an embodiment of the disclosure.

Referring to FIG. 7, a flowchart depicting a process for enacting various remedial actions to correct latch operations in accordance with an embodiment of the disclosure. In a number of embodiments, the process 700 can begin by determining that an error has occurred with a latch (block 710). This step can be similar to that described with respect to FIG. 6. Typically, in response to a detected error, one or more remedial actions are undertaken to correct the error. Often, the first or main remedial action is to increase the power supply to the affected latches. The process 600 first determine however, if the power supply level can be increased (block 715). When it is determined that the power supply level can be increased, the process can follow through and increase the power supply levels in one or more latches (block 720). Typically, this is done only to the affected latches, but certain power supplies may globally increase power supply within the storage device. Once increased, the process 700 can determine if the gate output error has ceased over time (block 725). If the error has ceased, the process 700 can end. However, if the error still persists, the process 700 can determine if the power supply level can be increased yet again (block 715).

If the power supply is not able to increase power to the affected latches, then the process can subsequently determine if the clock speed can be lowered (block 735). When the clock speed can be lowered, the process 700 can lower the clock speed (block 740). As described above, a reduced clock speed can help to alleviate thermal activity which can lead to an increased potential for errors. Once lowered, the process 700 can again determine if the gate output error has cased (block 745). If the error is stopped, the process 700 can end. However, if the clock speed cannot be lowered any further, then the process 700 can again attempt to determine if the power supply can be increased before moving onto another remedial action (block 715).

When it is determined that the power supply level cannot be increased and the clock speed (e.g., clock signal frequency) cannot be decreased, the process 700 can attempt to determine if cooling actions can be taken and/or increased to lower the operating temperature of the storage device (block 755). In many embodiments, if the cooling cannot be increased, and/or no other remedial actions remain with a detected error, the process 700 may halt operations (block 770). In this way, data corruption may be avoided. However, when cooling operations can be increased or occur, the process 700 can increase cooling of the storage device (block 760). Cooling can be achieved in a variety of ways and is not limited to methods currently employed. In some embodiments, the cooling may be achieved through the use of one or more fans or cooling systems. These may be internal to the storage device or may be a part of a storage system or a host-computing device. By increasing cooling, thermal issues may be resolved.

Once the cooling has increased, the process 700 can again determine if the gate output error has ceased (block 765). If the error has ceased, the process 700 can end. However, if the error still persists, then the process 700 can again attempt to take remedial actions, such as checking if the power supply can be increased to the latches (block 715).

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A device comprising a plurality of components, including:
   a processor;
   a memory array comprising a plurality of memory devices;
   an interface bus comprising at least a plurality of latches configured to receive and output data and a clock signal;
   a power supply configured to provide power to the plurality of latches wherein the power supplied to at least one of the plurality of latches is configured to provide a different voltage; and
   an interface bus optimization logic configured to:
      direct the power supply to provide power to the plurality of latches;
      direct the output of at least two of the plurality of latches into a comparator wherein a first latch is provided a first voltage and a second latch is provided the different second voltage;
      monitor the comparator output to determine the presence of an error in at least one of the latches; and
      execute, in response to a determined error, a remedial action associated with the plurality of latches.

2. The device of claim 1, wherein the different voltage is a voltage drop.

3. The device of claim 2, wherein the voltage drop is achieved through the use of a resistor between the power supply and the at least one of the plurality of latches.

4. The device of claim 2, wherein the voltage drop is static and determined at the time of manufacture.

5. The device of claim 2, wherein the voltage drop is configured to be dynamically changed by the interface bus optimization logic.

6. The device of claim 5, wherein the voltage drop is achieved through the use of a variable resistor.

7. The device of claim 5, wherein the plurality of latches are configured for use in an interface and the voltage drop is changed based on the type of interface.

8. The device of claim 5, wherein the plurality of latches are configured for use in an interface and the voltage drop is changed based on the type of data being transmitted across the interface.

9. The device of claim 1, wherein the comparator is an exclusive-OR (XOR) gate.

10. The device of claim 1, wherein the first latch and second latch are located within the same thermal zone.

11. The device of claim 1, wherein the plurality of latches is configured into a bus group for an interface.

12. The device of claim 11, wherein the latch provided a second different voltage is also configured into the bus group.

13. The device of claim 1, wherein the second latch is the same model of component as the first latch.

14. The device of claim 1, wherein the remedial action is to increase the voltage of the power provided by the power supply.

15. The device of claim 1, wherein the remedial action is to decrease the clock signal frequency.

16. The device of claim 1, wherein the remedial action is to direct one or more cooling actions configured to decrease the temperature of the plurality of latches.

17. A method, comprising:
   directing a power supply of a storage device to provide power to a plurality of latches configured in a bus group for an interface wherein a first latch is provided a first voltage and a second latch is provided a lower second voltage;
   directing the output of first latch and second latch into a comparator;
   monitoring the comparator output to determine the presence of an error in at least one of the latches;
   determining if a first remedial action associated with the plurality of latches can be performed; and
   performing, in response to determining the action can be performed, the remedial action.

18. The method of claim 17, wherein the first remedial action is to direct the power supply to increase the voltage provided.

19. The method of claim 18, wherein, in the event the voltage cannot be increased:
   determining if the clock signal frequency associated with the plurality of latches can be decreased; and
   decreasing the clock signal frequency, in response to determining the clock signal frequency can be decreased.

20. A device, including:
   a processor;
   an interface bus comprising at least a plurality of components configured to receive and output data;
   a power supply configured to provide power to the plurality of components at a first voltage wherein the power supplied to at least one of the components is configured to provide a second lower voltage; and
   an interface bus optimization logic configured to:
      direct the data output of at least two of the components into a comparator;
      monitor the comparator output to determine the presence of a different of output between the at least two components; and
      execute, in response to a determined error, a remedial action configured to correct the difference in component output.

* * * * *